(12) United States Patent
Choi et al.

(10) Patent No.: US 7,851,275 B2
(45) Date of Patent: Dec. 14, 2010

(54) PIXEL OF IMAGE SENSOR AND METHOD FOR FABRICATING THE SAME

(76) Inventors: Woon-Il Choi, 1 Hyangjeong-dong, Heungbuk-gu, Cheongju-si, Chungcheongbuk-do 361-725 (KR); Hyung-Sik Kim, 1 Hyangjeong-dong, Heungbuk-gu, Cheongju-si, Chungcheongbuk-do 361-725 (KR); Ui-Sik Kim, 1 Hyangjeong-dong, Heungbuk-gu, Cheongju-si, Chungcheongbuk-do 361-725 (KR)

( * ) Notice: Subject to any disclaimer, the term of this patent is extended or adjusted under 35 U.S.C. 154(b) by 1122 days.

(21) Appl. No.: 11/444,394

(22) Filed: Jun. 1, 2006

(65) Prior Publication Data
US 2006/0273354 A1    Dec. 7, 2006

(30) Foreign Application Priority Data
Jun. 3, 2005    (KR) .............. 10-2005-0047992

(51) Int. Cl.
*H01L 21/00* (2006.01)
(52) U.S. Cl. ............... 438/144; 257/239; 257/E21.617
(58) Field of Classification Search ............ 438/60, 438/75, 144; 257/219, 225, 239, 240, 241, 257/246, E21.185, E21.189, E21.617
See application file for complete search history.

(56) References Cited

U.S. PATENT DOCUMENTS

| 6,291,280 | B1 | 9/2001 | Rhodes |
| 6,545,301 | B2 | 4/2003 | Kamimura |
| 2002/0048871 | A1* | 4/2002 | Sekikawa et al. ......... 438/197 |
| 2004/0217398 | A1 | 11/2004 | Lee |
| 2004/0217426 | A1 | 11/2004 | Lee |

FOREIGN PATENT DOCUMENTS

KR    10-2004-0093936    11/2004

* cited by examiner

*Primary Examiner*—W. David Coleman
*Assistant Examiner*—Su C Kim
(74) *Attorney, Agent, or Firm*—McAndrews Held & Malloy, Ltd.

(57) ABSTRACT

A pixel of an image sensor includes a polysilicon layer, and an active region which needs to be electrically coupled with the polysilicon layer, wherein the polysilicon layer extends over a portion of the active region, such that the polysilicon layer and the active region are partially overlapped, and the polysilicon layer and the active region are coupled through a buried contact structure.

8 Claims, 8 Drawing Sheets

PIXEL OF IMAGE SENSOR AND METHOD FOR FABRICATING THE SAME

FIELD OF THE INVENTION

The present invention relates to a complementary metal oxide semiconductor (CMOS) image sensor; and, more particularly, to a contact structure in a pixel and a method for fabricating the same.

DESCRIPTION OF RELATED ARTS

A complementary metal oxide semiconductor (CMOS) image sensor is a device which transforms optical images into electrical signals by employing a CMOS fabrication technology. The CMOS image sensor forms as many MOS transistors as the number of pixels, and utilizes a switching method where outputs are sequentially detected using the MOS transistors. When compared to the widely used conventional charge coupled device (CCD) image sensor, the CMOS image sensor has an easier operation method and is capable of various scanning methods. Furthermore, the CMOS image sensor allows a signal processing circuit to be integrated in a single chip, making device miniaturization possible. Also, since the compatible CMOS technology is used, the production cost can be reduced and the power consumption can be decreased.

Figure 1:
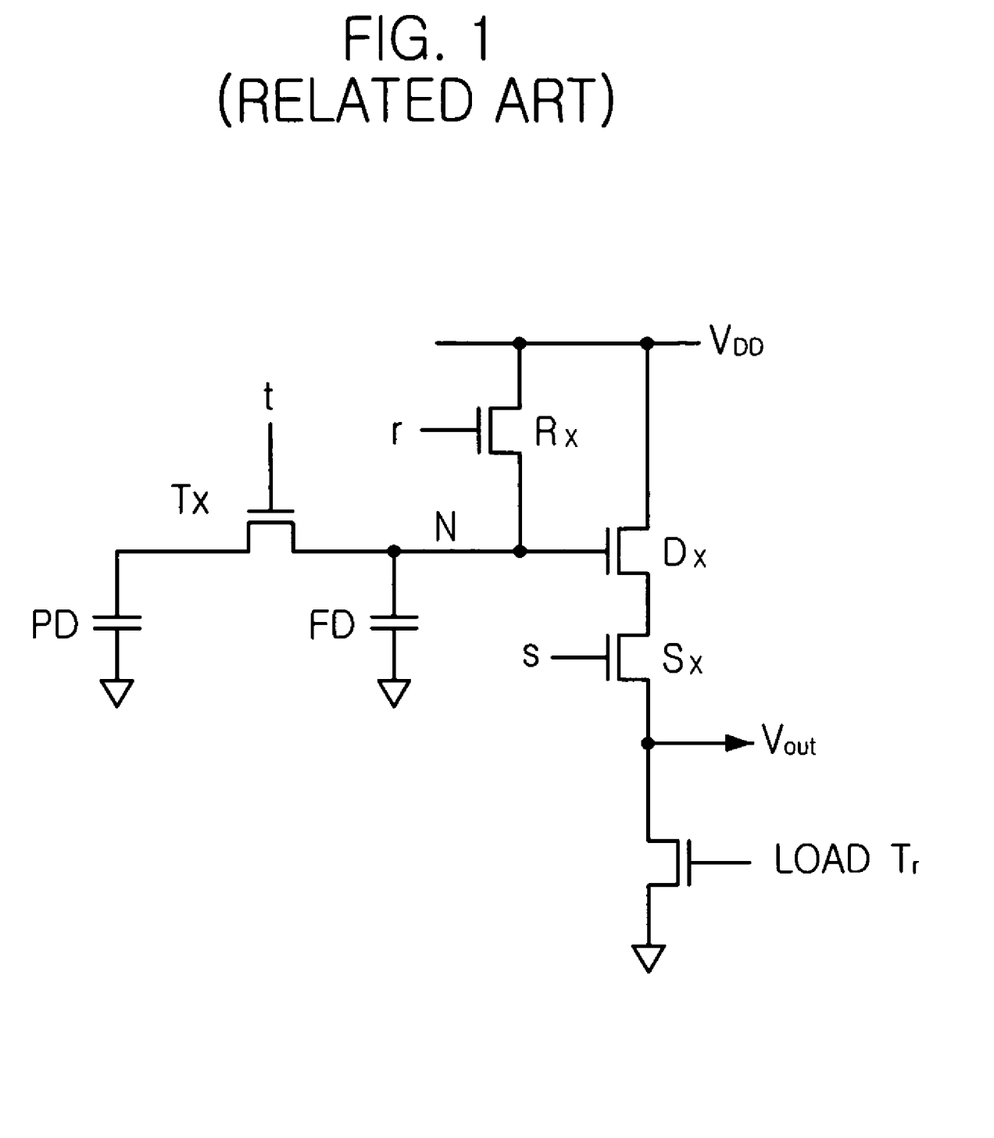
FIG. 1 is a circuit diagram illustrating a unit pixel having one photodiode and four NMOS transistors in a typical CMOS image sensor.

FIG. 1 is a circuit diagram illustrating a unit pixel having one photodiode and four N-channel metal oxide semiconductor (NMOS) transistors in a typical CMOS image sensor.

The CMOS image sensor includes: a photodiode PD, a transfer transistor Tx, a reset transistor Rx, a drive transistor Dx, and a select transistor Sx. The photodiode PD receives light and generates photocharges, and the transfer transistor Tx transfers the photocharges integrated at the photodiode PD to a floating diffusion node FD. The reset transistor Rx resets the floating diffusion node FD by setting an electric potential of the floating diffusion node FD to a desired value and discharging the photocharges. The drive transistor Dx functions as a source follower buffer amplifier, and the select transistor Sx functions as a switching device which allows addressing. A load transistor LOAD Tr is formed outside the unit pixel for reading output signals.

Figure 2:
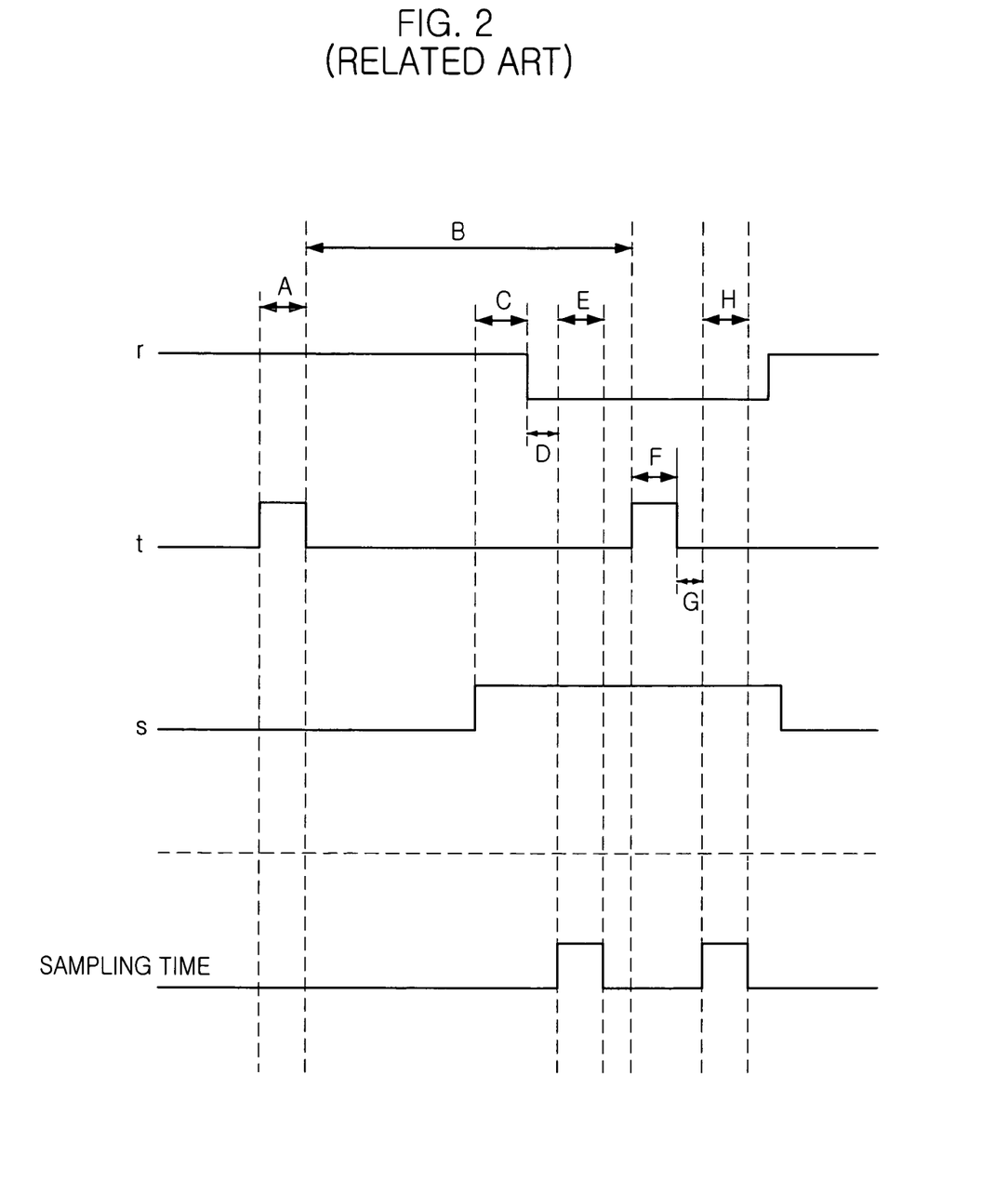
FIG. 2 is a diagram illustrating a control timing of a signal which controls each transistor of the typical unit pixel illustrated in FIG. 1.

FIG. 2 is a diagram illustrating a control timing of a signal which controls each of the transistors in the typical unit pixel illustrated in FIG. 1. A method for obtaining pixel data by employing a correlated double sampling (CDS) method is described below.

During a section A, the transfer transistor Tx and the reset transistor Rx are turned on and the select transistor Sx is turned off, thus the photodiode PD is in a depletion state.

During a section B, the transfer transistor Tx is turned off. After the turning off of the transfer transistor Tx, the photodiode PD absorbs light to generate photocharges and integrates the photocharges. The section B is maintained until the transfer transistor Tx is turned on again regardless of conditions of the reset transistor Rx and the select transistor Sx.

During a section C, the reset transistor Rx is maintained turned on, the transfer transistor Tx is maintained turned off, and the select transistor Sx is turned on. Thus, a reset voltage is transferred during the section C through the drive transistor Dx, which is operated by a sensing node N (see FIG. 1), and the select transistor Sx. The section C is referred to as a reset transferring section.

During a section D, the reset transistor Rx is turned off to settle the reset voltage generated in the section C. The section D is referred to as a reset settling section.

During a section E, the reset voltage of the section D is sampled. The section E is referred to as a reset sampling section.

During a section F, the reset transistor Rx is maintained turned off, the select transistor Sx is maintained turned on, and the transfer transistor Tx is turned on. Thus, a data voltage generated by the photocharges integrated at the photodiode PD during the section B is transferred to the sensing node N. During the section F, the drive transistor Dx, which is operated by the sensing node N, and the select transistor Sx transfer the data voltage. The section F is referred to as a data transferring section.

During a section G, the transfer transistor Tx is turned off. Thus, the data voltage generated during the section F is settled during the section G. The section G is referred to as a data settling section.

During a section H, the data voltage of the section G is sampled. The section H is referred to as a data sampling section.

A difference between the reset voltage and the data voltage sampled respectively in the section E and the section H becomes an output value of a CMOS image sensor with respect to an image inputted from the photodiode PD.

The conventional unit pixel operations described above are performed almost identically in other types of unit pixels. If a row based scan method is chosen for an operation of a pixel array where the typical unit pixels are arrayed, a first row to a last row are sequentially scanned.

Therefore, when obtaining a data from a pixel in an $n^{th}$ row after obtaining a data from a pixel in an $n-1^{th}$ row, all pixels in previous rows, including the $n-1^{th}$ row, are cleaned up and then a photo integration process is performed again.

Meanwhile, the typical unit pixel structure utilizes four transistors per unit pixel for a CDS support, and thus, the size of the unit pixel becomes larger. Furthermore, in order to embody the pixel on a limited surface area, the surface of the photodiode is also generally limited. A fill factor represents a ratio of the surface area of the photodiode with respect to the entire surface area of the unit pixel. The fill factor is one of the important factors related to the image sensor performance. A large fill factor means a large capability to change a received light into an electrical signal. A larger fill factor means a larger range of fluctuation in an output voltage of a unit pixel. Thus, a dynamic range of a CMOS image sensor increases.

In an image sensor with low integration scale of approximately 0.18 μm or higher, a four transistor structure having a fill factor of approximate 30% shows a satisfactory level of characteristics. However, although the size of the pixel is decreasing as the semiconductor technology improves, a light receiving unit needs more than a certain surface area. Thus, the fill factor needs to be enlarged. Especially, it is generally essential to enlarge the fill factor in a highly integrated image sensor of approximately 0.18 μm or under, which is being developed worldwide.

One of the methods being developed to improve the fill factor is to change the typical pixel type using four transistors into a pixel type using three transistors.

However, the pixel type using three transistors has a unsatisfactory level of noise, and consequently needs to be further developed.

Therefore, a contact structure is suggested to reduce the surface area of the contact within a pixel to downsize the pixel. Thus, in a unit pixel having a circuit structure substantially identical to the unit pixel in FIG. 1, a gate of a drive transistor Dx and a floating diffusion region FD are generally required to be coupled, and a gate of the drive transistor Dx and a drain diffusion region of a reset transistor Rx are generally required to be coupled.

Therefore, a diffusion region and polysilicon for use as a gate are coupled to each other by a metal line to obtain pixel shrinkage in the typical method.

Figure 3:
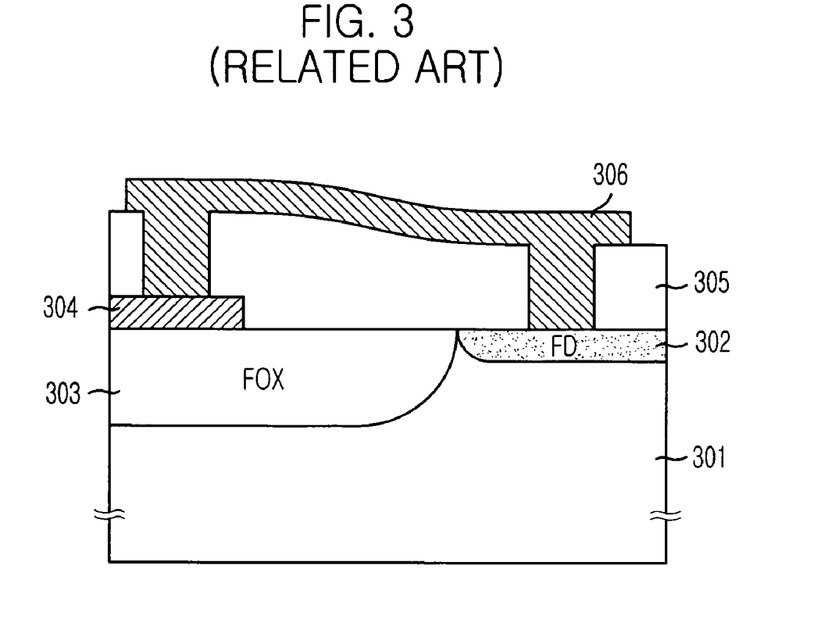
FIG. 3 is a partial cross-sectional view illustrating a pixel structure from FIG. 1 where a floating diffusion region and a polysilicon layer for use as a gate of a drive transistor are coupled through a metal line contact.

FIG. 3 is a cross-sectional view illustrating a coupling between a polysilicon layer for use as a gate of a drive transistor and a diffusion region. Herein, the diffusion region can include one of a floating diffusion region and a drain diffusion region of a reset transistor.

The diffusion region 302 is formed under a top surface of a substrate 301, and a polysilicon layer 304 for use as a gate of a drive transistor Dx is formed over a device isolation region 303. A metal line 306 penetrates into an insulation layer 305 and couples the diffusion region 302 with the polysilicon layer 304.

However, the typical contact structure and method generally require forming two contacts, one on the polysilicon layer and one on the diffusion region. Since such structure has a large contact surface area within the limited pixel area, a surface area for a photodiode is small.

SUMMARY OF THE INVENTION

It is, therefore, an object of the present invention to provide an image sensor, which can obtain an improved fill factor within a limited pixel area and a method for fabricating the same.

In accordance with an aspect of the present invention, there is provided a pixel of an image sensor, the pixel including: a polysilicon layer; and an active region which needs to be electrically coupled with the polysilicon layer, wherein the polysilicon layer extends over a portion of the active region, such that the polysilicon layer and the active region are partially overlapped, and the polysilicon layer and the active region are coupled through a buried contact structure.

In accordance with another aspect of the present invention, there is provided a pixel of an image sensor, the pixel including: a polysilicon layer; and an active region electrically coupled with the polysilicon layer, wherein the polysilicon layer extends over a portion of the active region, such that the polysilicon layer and the active region are partially overlapped, and the polysilicon layer and the active region are coupled through a butting contact structure.

In accordance with still another aspect of the present invention, there is provided a pixel of an image sensor, the pixel including: a polysilicon layer; and an active region electrically coupled with the polysilicon layer, wherein the polysilicon layer is formed to extend over a portion of the active region, such that the polysilicon layer and the active region are partially overlapped, the polysilicon layer comprising a first opening exposing a portion of the active region; an insulation layer formed over a portion of the polysilicon layer, the insulation layer comprising a second opening overlapping with the first opening and having a larger width than the first opening; and a metal layer filled into the first and the second openings.

In accordance with still another aspect of the present invention, there is provided a method for fabricating a pixel of an image sensor, including: defining an active region in a substrate; forming a lowly doped diffusion region in the active region of the substrate; forming a gate oxide layer and a first polysilicon layer over the substrate; performing an ion implantation process using a buried contact mask pattern to break down the gate oxide layer in a contact region; forming a second polysilicon layer to a desired thickness over the first polysilicon layer; performing gate masking and etching processes to pattern the first and the second polysilicon layers; and forming a highly doped diffusion region in the active region of the substrate.

In accordance with still another aspect of the present invention, there is provided a method for fabricating a pixel of an image sensor, including: defining an active region in a substrate; forming a lowly doped diffusion region in the active region of the substrate; forming a gate oxide layer and a polysilicon layer over the substrate; selectively etching the polysilicon layer to a predetermined thickness using a buried contact mask pattern; performing an ion implantation process using the buried contact mask pattern to break down the gate oxide layer in a contact region; performing gate masking and etching processes to pattern the polysilicon layer; and forming a highly doped diffusion region in the active region of the substrate.

In accordance with still another aspect of the present invention, there is provided a method for fabricating a pixel of an image sensor, including: defining an active region in a substrate; forming a lowly doped diffusion region in the active region of the substrate; forming a gate oxide layer and a first polysilicon layer over the substrate; etching the first polysilicon layer and the gate oxide layer using a buried contact mask pattern to form a contact hole exposing a portion of the lowly doped diffusion region; forming a second polysilicon layer over the first polysilicon layer, the second polysilicon layer filling the first contact hole; performing gate masking and etching processes to pattern the first and the second polysilicon layers; and forming a highly doped diffusion region in the active region of the substrate.

In accordance with still another aspect of the present invention, there is provided a method for fabricating a pixel of an image sensor, including: defining an active region in a substrate; forming a lowly doped diffusion region in the active region of the substrate; forming a gate oxide layer and a polysilicon layer over the substrate; selectively etching the polysilicon layer to form a polysilicon pattern extending over a portion of the lowly doped diffusion region, such that the polysilicon pattern and the lowly doped diffusion region are partially overlapped; forming a highly doped diffusion region in the active region of the substrate; forming an insulation layer and selectively etching the insulation layer to expose an edge portion of the polysilicon pattern and the lowly doped diffusion region to form a butting contact hole; and filling a metal layer into the butting contact hole.

BRIEF DESCRIPTION OF THE DRAWINGS

The above and other objects and features of the present invention will become better understood with respect to the following description of the exemplary embodiments given in conjunction with the accompanying drawings, in which.

DETAILED DESCRIPTION OF THE INVENTION

A pixel of an image sensor and a method for fabricating the same in accordance with exemplary embodiments of the present invention will be described in detail with reference to the accompanying drawings.

In the following embodiments of the present invention, the number of contacts within a pixel is decreased using a buried contact or a butting contact, such that, the pixel size can be decreased while securing a fill factor for obtaining stable light characteristics. That is, by stably reducing the pixel size using an improved contact structure, a portion of the surface area which has been used by a conventional contact can be used in reducing the total surface area of the pixel, and another portion of the surface area which has been used by the conventional contact can be used in securing the fill factor. Thus, limitations related to the decreased size of the pixel can be reduced.

The following embodiments of the present invention can allow an additional shrinking of a pixel, and thus, can be directly reflected on a current technology of developing a complementary metal oxide semiconductor (CMOS) image sensor of approximately 0.13 μm or under.

A contact portion within a pixel which can be reduced by applying the following embodiments of the present invention is a coupling portion between polysilicon and an active region, e.g., floating diffusion region. The coupling portion includes: a polysilicon contact+an active contact+a metal coupling. That is, the specific embodiment of the present invention can be applied to a coupling between a gate of a drive transistor Dx and a floating diffusion region FD, or a coupling between the gate of the drive transistor Dx and a drain diffusion region of a reset transistor Rx.

The following embodiments of the present invention can be applied to pixels with different structures other than the conventional pixel type shown in FIG. 1. That is, this specific embodiment of the present invention can be applied to other types of pixel structures which need a coupling between a polysilicon layer and an active region. The contact structure and the contact method in this specific embodiment of the present invention can be more effective than reducing a transistor with respect to a pixel shrinking.

Figure 4:
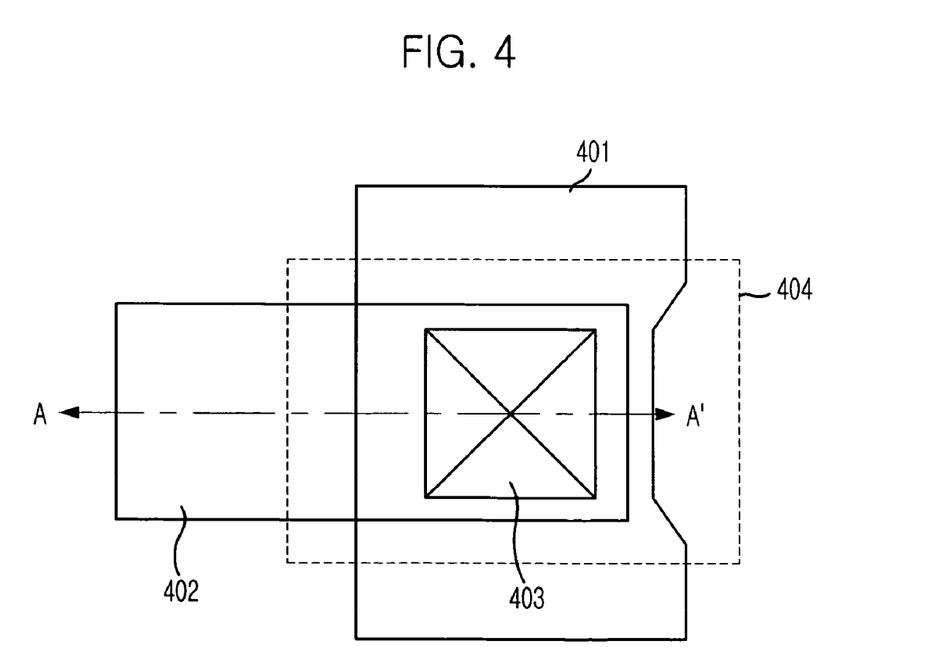
FIG. 4 is a top view illustrating a buried contact structure in accordance with a specific embodiment of the present invention.

FIG. 4 is a top view illustrating a buried contact structure formed between a gate (e.g., a polysilicon layer) of a drive transistor and a floating diffusion region in accordance with a specific embodiment of the present invention.

Instead of using a metal line to couple the floating diffusion region 401 to the polysilicon layer 402, the polysilicon layer 402 is formed to extend in a manner, such that the polysilicon layer 402 aligns with the floating diffusion region 401. A buried contact structure 403 couples the polysilicon layer 402 to the floating diffusion region 401 without the metal line. Reference numeral 404 represents a lowly doped N⁻ diffusion region.

Figure 5A:
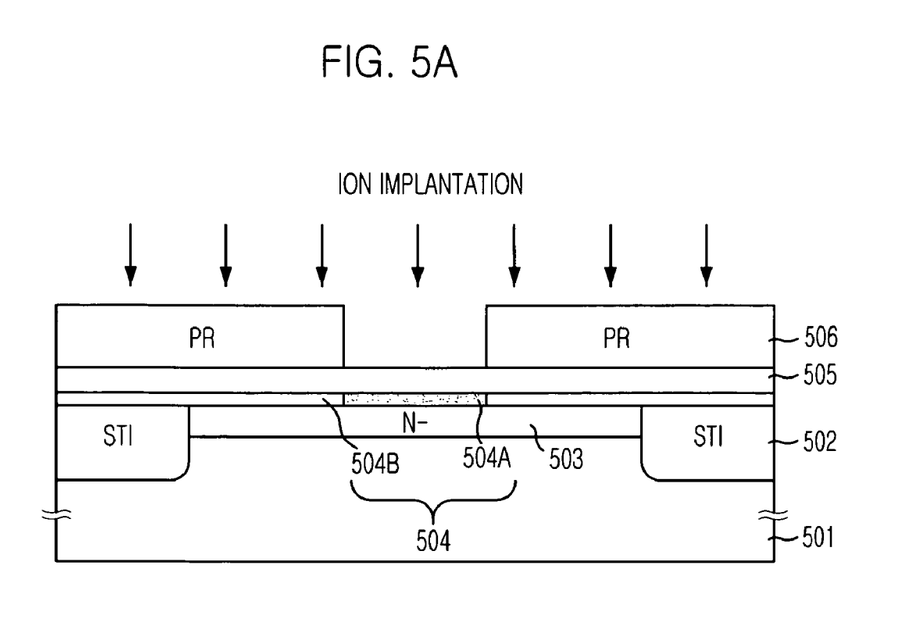
FIGS. 5A and 5B are cross-sectional views illustrating the buried contact shown in FIG. 4 cut along a perforated line A-A' in accordance with a specific embodiment of the present invention.
Figure 5B:
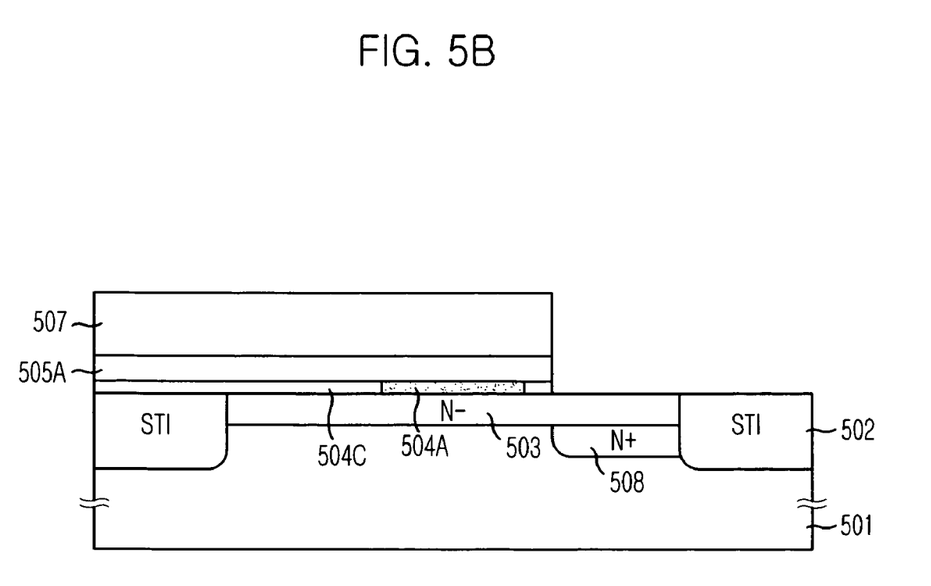

FIGS. 5A and 5B are cross-sectional views illustrating a buried contact structure cut along a perforated line A-A' illustrated in FIG. 4 in accordance with a specific embodiment of the present invention.

Referring to FIG. 5A, device isolation regions 502 are formed by employing a shallow trench isolation (STI) method to define a field region and an active region of a substrate 501. An N⁻ diffusion region 503 is formed by a low concentration ion implantation process. A gate oxide layer 504 having a thickness of approximately 50 Å is formed, and then, a first polysilicon layer 505 having a small thickness is formed. A buried contact mask pattern 506 exposing a buried contact region is formed by employing a photolithography process, and then, an ion implantation process is performed to break down a portion of the gate oxide layer 504. Herein, conditions for the ion implantation process include using a high current device and setting a peak dose of the ion implantation process at the gate oxide layer 504. Consequently, the portion of the gate oxide layer 504 at the buried contact region is broken down by dopants, and obtains conductivity. This portion of the gate oxide layer is referred to as a broken-down gate oxide layer 504A, and the rest of the gate oxide layer is referred to as a remaining gate oxide layer 504B. Thus, the first polysilicon layer 505 and the N⁻ diffusion region 503 are electrically coupled together.

Referring to FIG. 5B, although not illustrated, the buried contact mask pattern 506 is removed, and a patterned second polysilicon layer 507, a patterned first polysilicon layer 505A, and a patterned remaining gate oxide layer 504C are formed. In more detail, a second polysilicon layer having a certain thickness is formed, such that the total thickness of the first polysilicon layer 505 and the second polysilicon layer is substantially the same as the thickness of a gate of a normal transistor.

Subsequently, the second polysilicon layer, the first polysilicon layer 505, and the remaining gate oxide layer 504B are patterned by employing gate masking and etching processes. Then, a high concentration ion implantation process is performed to form an N⁺ floating diffusion region 508.

Therefore, a contact between the polysilicon layers, i.e., the patterned first polysilicon layer 505A and the patterned second polysilicon layer 507, and the N⁺ floating diffusion region 508 can be achieved. That is, the polysilicon layers are electrically coupled to the N⁺ floating diffusion region 508 through the broken-down gate oxide layer 504A and the N⁻ diffusion region 503.

A thickness of the first polysilicon layer 505 is controlled based on capabilities of an ion implantation device for breaking down the gate oxide layer 504. Since polysilicon formation under approximately 500 Å is often unstable, the first polysilicon layer 505 is formed in a thickness ranging from approximately 500 Å to approximately 1,000 Å, considering the formation stability and ion implantation capability. The second polysilicon layer is formed to have a thickness ranging from approximately 1,500 Å to approximately 2,000 Å since the total thickness of the first polysilicon layer 505 and the second polysilicon layer should reach a desired gate thickness. Meanwhile, the ions implanted during the ion implantation process for breaking down the gate oxide layer 504 may include arsenic (As).

Figure 6:
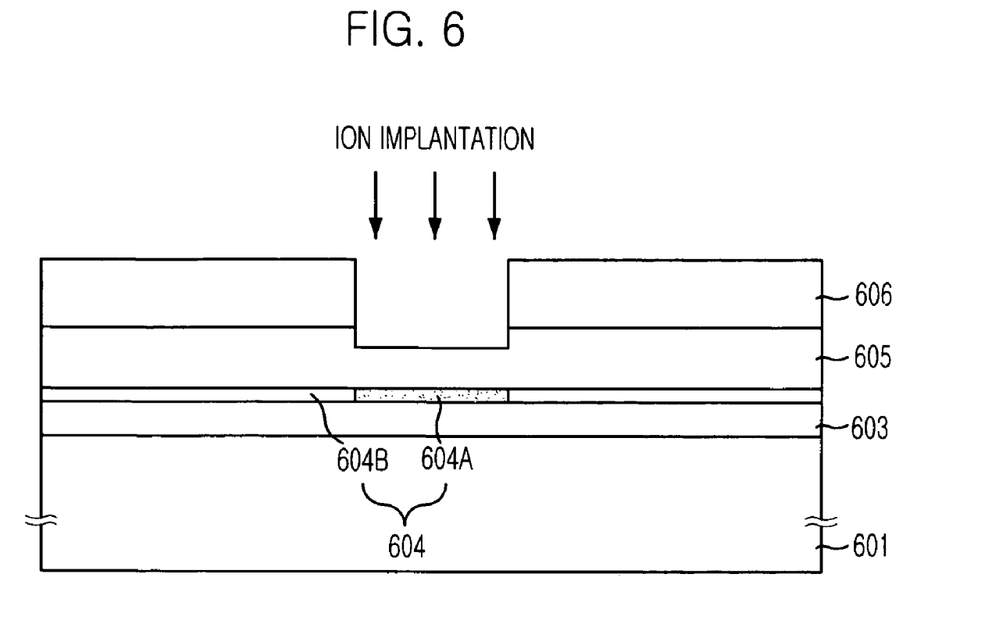
FIG. 6 is a cross-sectional view illustrating a buried contact in accordance with another specific embodiment of the present invention.

FIG. 6 is a cross-sectional view illustrating another buried contact structure according to a specific embodiment of the present invention. A portion of a polysilicon layer formed at a buried contact region can have a small thickness because that portion does not constitute a gate of a transistor, but is a portion extended from the gate.

Therefore, instead of forming two polysilicon layers, one polysilicon layer having a desired gate thickness is formed and a portion of the polysilicon layer at the buried contact region is etched using a buried contact mask. Then, an ion implantation process to break down a gate oxide layer is performed.

As illustrated, device isolation regions (not shown) are formed in a substrate 601 to define a field region and an active region. An $N^-$ diffusion region 603 is formed by employing a low concentration ion implantation process. A gate oxide layer 604 having a thickness of approximately 50 Å is formed. A patterned polysilicon layer 605 is formed over the gate oxide layer 604, and a buried contact mask pattern 606 exposing the buried contact region is formed by employing a photolithography process. In more detail, a polysilicon layer having a thickness ranging from approximately 2,000 Å to approximately 2,500 Å is formed, and a portion of the polysilicon layer is etched using the buried contact mask pattern 606 to form the patterned polysilicon layer 605. An ion implantation process to break down the gate oxide layer 604 is performed, and consequently, a portion of the gate oxide layer 604 at the buried contact region is broken down to form a broken-down gate oxide layer 604A. The rest of the gate oxide layer 604 is referred to as a remaining gate oxide layer 604B.

Subsequently, the buried contact mask pattern 606 is removed, and gate masking and etching processes are performed to further pattern the patterned polysilicon layer 605. Then, a high concentration ion implantation process is performed to form an $N^+$ floating diffusion region (not shown).

Figure 7A:
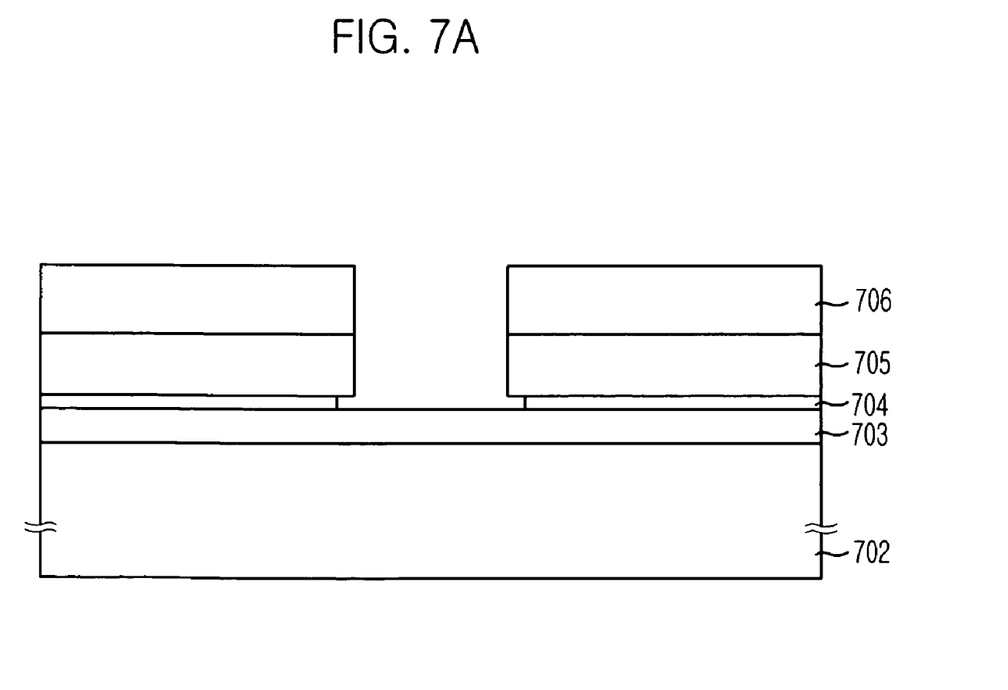
FIGS. 7A and 7B are cross-sectional views illustrating a buried contact in accordance with another specific embodiment of the present invention.
Figure 7B:
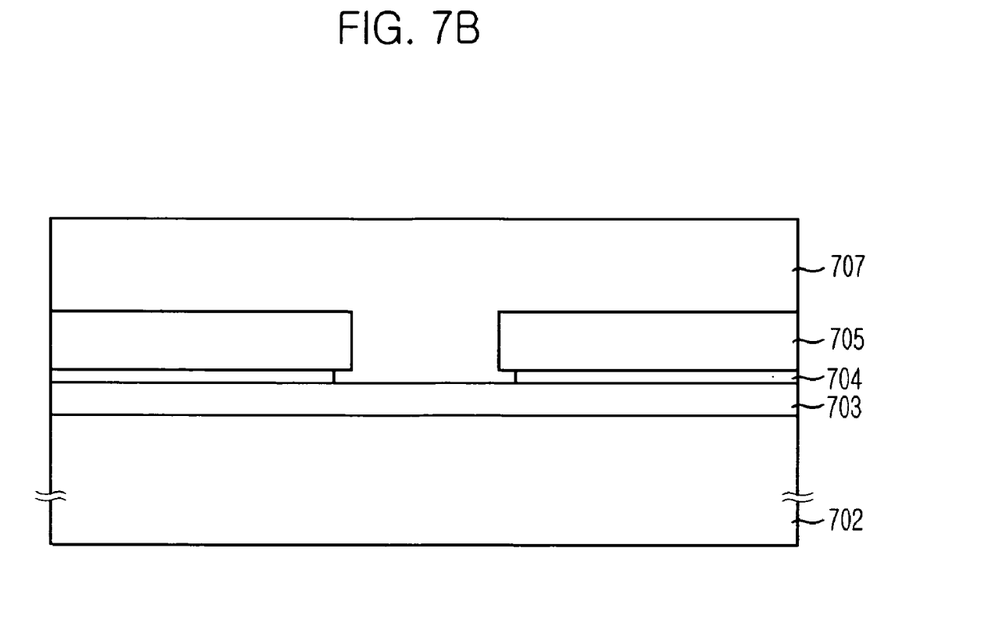

FIGS. 7A and 7B are cross-sectional views illustrating another buried contact structure according to another embodiment of the present invention. Instead of using the ion implantation process to break down a gate oxide layer as described in FIGS. 5A and 5B, a second polysilicon layer is directly coupled to a portion of an active region exposed by selectively etching a first polysilicon layer and a gate oxide layer.

Referring to FIG. 7A, device isolation regions (not shown) are formed by employing a device isolation process to define a field region and an active region of a substrate 702. An $N^-$ diffusion region 703 is formed by a low concentration ion implantation process. A patterned gate oxide layer 704 and a patterned first polysilicon layer 705 are formed over the $N^-$ diffusion region 703. In more detail, a gate oxide layer having a thickness of approximately 50 Å is formed, and then, a first polysilicon layer having a small thickness is formed. A buried contact mask pattern 706 exposing a buried contact region is formed by employing a photolithography process, and then, the first polysilicon layer and the gate oxide layer are etched using the buried contact mask pattern 706.

Referring to FIG. 7B, the buried contact mask pattern 706 is removed, and a second polysilicon layer 707 is formed, such that the total thickness of the patterned first polysilicon layer 705 and the second polysilicon layer 707 reaches a thickness substantially identical to the thickness of a gate of a normal transistor.

Although not shown, gate masking and etching processes are performed to further pattern the second polysilicon layer 707 and the patterned first polysilicon layer 705. A high concentration ion implantation process is employed to form an $N^+$ floating diffusion region. Consequently, a contact between the polysilicon layer, including the patterned first polysilicon layer 705 and the second polysilicon layer 707, and the $N^+$ floating diffusion region can be achieved.

Figure 8:
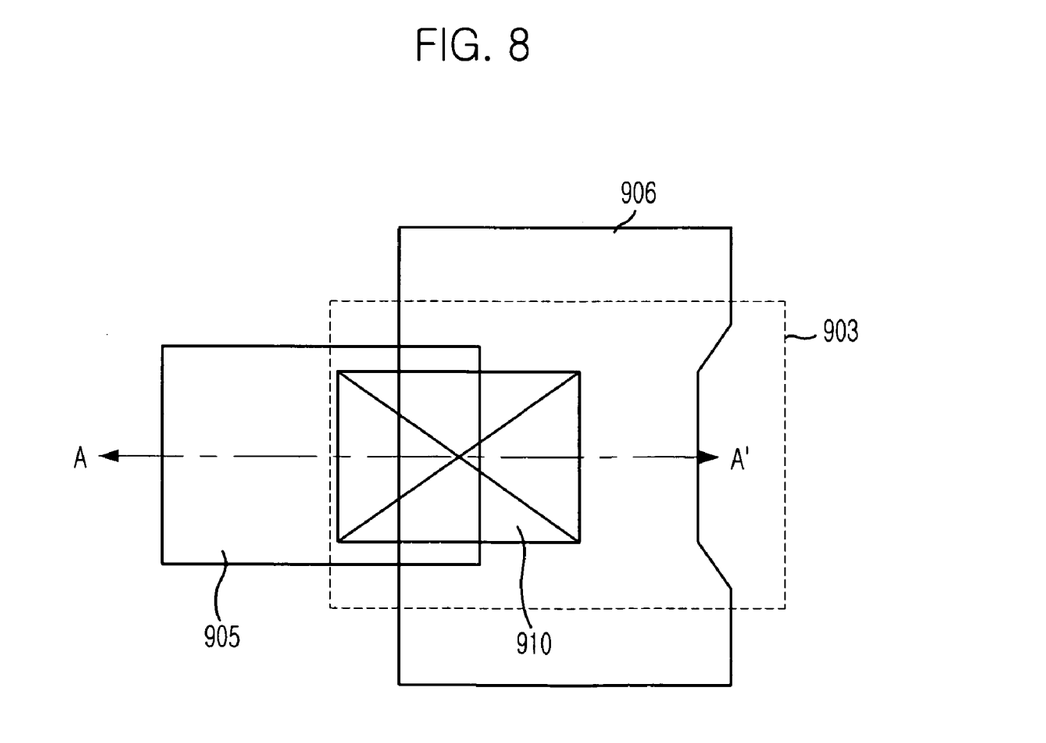
FIG. 8 is a top view illustrating a butting contact structure in accordance with a specific embodiment of the present invention.

FIG. 8 is a top view illustrating a butting contact structure formed between a gate polysilicon of a drive transistor and a floating diffusion region in accordance with a specific embodiment of the present invention.

Although the butting contact structure in accordance with a specific embodiment of the present invention uses a metal line, contacts are not formed for each of an $N^+$ floating diffusion region 906 and a patterned polysilicon layer 905. That is, two separate contacts are not formed. Instead, the patterned polysilicon layer 905 is formed to extend in a manner, such that the patterned polysilicon layer 905 aligns with the $N^+$ floating diffusion region 906. Then, one butting contact hole exposing both the patterned polysilicon layer 905 and the $N^+$ floating diffusion region 906 is formed, and a metal line is buried in the butting contact hole. Undescribed reference numeral 903 represents a lowly doped diffusion region, and undescribed reference number 910 represents a butting contact region.

Figure 9:
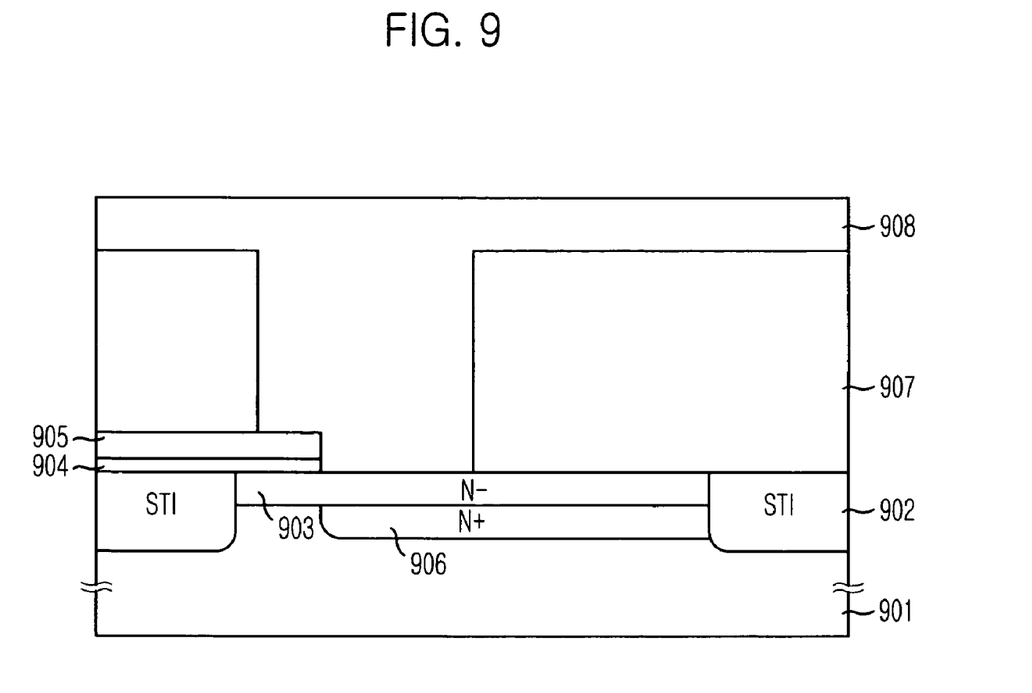
FIG. 9 is a cross-sectional view illustrating the butting contact shown in FIG. 8 cut along a perforated line A-A'.

FIG. 9 is a cross-sectional view illustrating the butting contact structure shown in FIG. 8 cut along a perforated line A-A'.

Device isolation regions 902 are formed by employing a shallow trench isolation (STI) method to define a field region and an active region of a substrate 901. The $N^-$ diffusion region 903 is formed by a low concentration ion implantation process. The patterned polysilicon layer 905 and a patterned gate oxide layer 904 are formed to partially overlap with the active region, i.e., the N diffusion region 903. In more detail, although not shown, a gate oxide layer having a thickness of approximately 50 Å is formed, and then, a polysilicon layer for use as a gate is formed.

The polysilicon layer and the gate oxide layer are etched using gate masking and etching processes.

The $N^+$ floating diffusion region 906 is formed by employing a high concentration ion implantation process. A patterned insulation layer 907 is formed in a manner to expose an edge portion of the patterned polysilicon layer 905 and the active region, i.e., the $N^-$ diffusion region 903. Consequently, a butting contact hole (not shown) is formed.

Then, a metal layer 908 for use as an interconnection line or plug is formed to provide the coupling between the patterned polysilicon layer 905 and the $N^+$ floating diffusion region 906.

Figure 10:
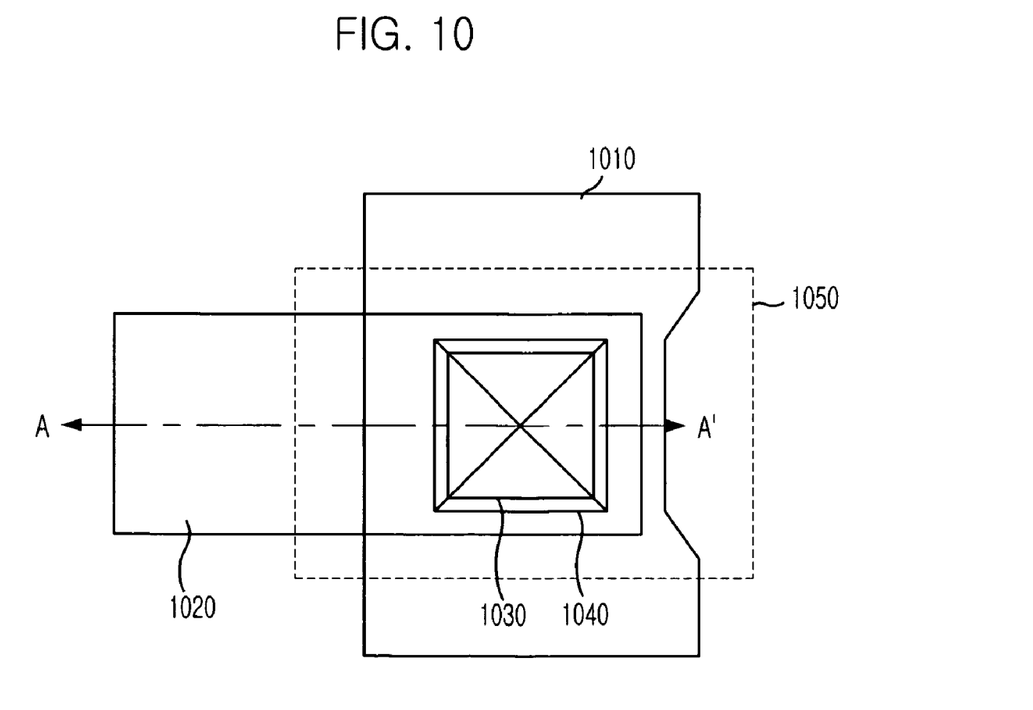
FIG. 10 is a top view illustrating another butting contact structure in accordance with a specific embodiment of the present invention.
Figure 11:
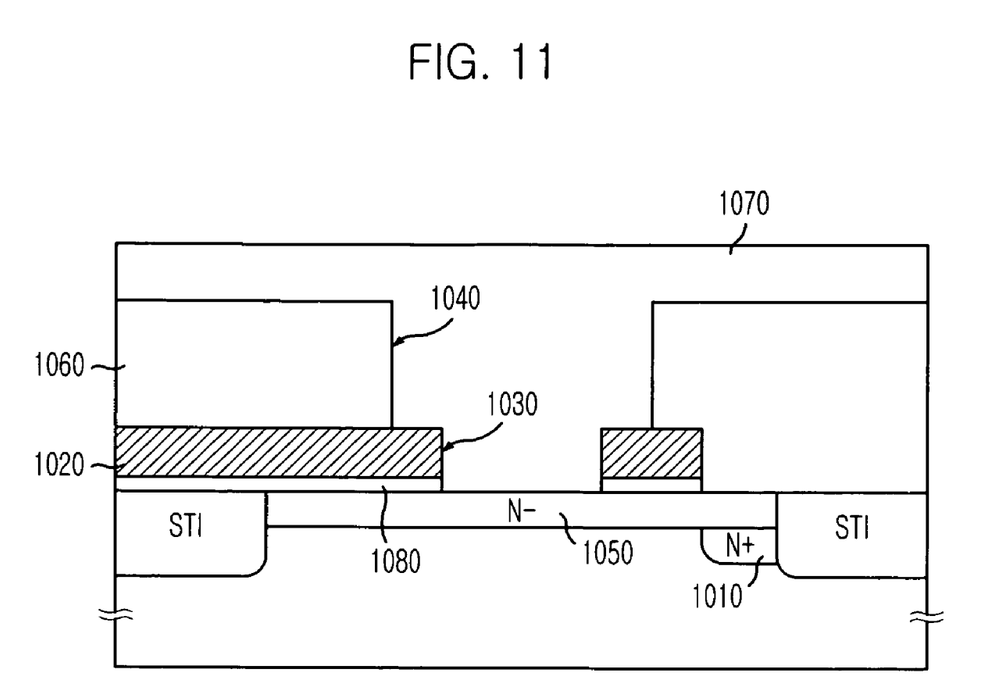
FIG. 11 is a cross-sectional view illustrating the butting contact structure shown in FIG. 10 cut along a perforated line A-A'.

FIG. 10 is a top view illustrating another butting contact structure in accordance with a specific embodiment of the present invention. FIG. 11 is a cross-sectional view illustrating the butting contact shown in FIG. 10 cut along a perforated line A-A'.

Referring to FIGS. 10 and 11, a patterned polysilicon layer 1020 for use as a gate is formed to extend in a manner, such that the patterned polysilicon layer 1020 aligns with a floating diffusion region 1010, which is a highly doped diffusion region. A first contact region 1030 is formed to overlap with a second contact region 1040. From the top view, the first contact region 1030 is formed in the second contact region 1040, and thus, the first contact region 1030 has a smaller contact size than the second contact region 1040. Reference numeral 1050 represents an N diffusion region which is a lowly doped diffusion region.

Referring to FIG. 11, an active region is defined by a STI device isolation method, and a lowly doped impurity region and a highly doped impurity region are formed below the top surface of a substrate. The lowly doped diffusion region 1050 and the highly doped diffusion region 1010 are floating diffusion regions.

The patterned polysilicon layer 1020 and a patterned gate oxide layer 1080 are formed to extend over the active region. That is, the patterned gate oxide layer 1080 and the patterned polysilicon layer 1020 partially overlap with the active region. A first opening, i.e., the first contact region 1030, is formed in the patterned gate oxide layer 1080 and the patterned polysilicon layer 1020 to expose another portion of the active region.

An insulation pattern 1060 with a second opening, i.e., the second contact region 1040, is formed in a manner, such that the second opening 1040 overlaps with the first opening 1030. The second opening 1040 has a larger width than the first opening 1030.

Then, a metal layer 1070 is filled into the first and the second openings, and thus, the coupling between the active region and the polysilicon pattern 1020 is achieved.

This particular embodiment of the present invention can be applied to a contact structure having further limitations with respect to the contact surface area as the size of the pixel becomes smaller.

When using the buried contact or the butting contact, the contact region is formed at one place when seen from a top view. Thus, the buried contact or the butting contact can be more effective with respect to a pixel shrinking than the conventional technology where two contact regions are needed.

Meanwhile, the specific embodiments of the present invention described above include descriptions on couplings between the floating diffusion region and the gate of the drive transistor. For a typical pixel having a circuit substantially identical to that shown in FIG. 1, the specific embodiments of the present invention can be applied to a coupling between a polysilicon layer for use as a gate of a drive transistor and a drain diffusion region of a reset transistor. Furthermore, the contact structure and methods of the present invention can be applied to a pixel structure needing a contact between a polysilicon layer and an active region, even for those pixel structures not having a circuit substantially identical to that in FIG. 1.

In accordance with the specific embodiments of the present invention, the surface area of the contact region in the pixel of an image sensor can be reduced by using the buried contact and/or the butting contact. That is, by stably reducing the pixel size using the improved contact structure, a portion of the surface area which has been used by a conventional contact can be used in reducing the total surface area of the pixel, and another portion of the surface area which has been used by the conventional contact can be used in securing the fill factor. Thus, limitations related to the decreased size of the pixel can be reduced.

The present application contains subject matter related to the Korean patent application No. KR 2005-47992, filed in the Korean Patent Office on Jun. 3, 2005, the entire contents of which being incorporated herein by reference.

While the present invention has been described with respect to certain specific embodiments, it will be apparent to those skilled in the art that various changes and modifications may be made without departing from the spirit and scope of the invention as defined in the following claims.

What is claimed is:

1. A method for fabricating a pixel of an image sensor, wherein the pixel comprises a floating diffusion region configured to receive photocharges from a photodetector of the pixel, a MOS drive transistor having a gate and configured as a source follower, and a MOS reset transistor having a drain, the method comprising:
   depositing an isolating field oxide about a peripheral portion of an area of a substrate to define an active region in the substrate;
   forming a lightly doped diffusion region in the active region of the substrate;
   forming a gate oxide layer over the active region, wherein the gate oxide layer further extends over a gate region of the MOS drive transistor;
   forming a first polysilicon layer over the gate oxide layer in the active region, wherein the first polysilicon layer further extends over the gate oxide layer of the gate region of the MOS drive transistor;
   forming a contact mask over the first polysilicon layer in the active region, wherein the contact mask leaves at least a portion of the first polysilicon layer exposed as an unmasked region;
   performing an ion-implantation process to direct ions through the first polysilicon layer and into the gate oxide layer to break down the gate oxide layer in the unmasked region to render the gate oxide layer in the unmasked region conductive thereby providing an electrically conductive path between the first polysilicon layer and the lightly doped diffusion region;
   removing the contact mask;
   forming a second polysilicon layer over the first polysilicon layer;
   performing gate masking and etching processes to pattern the first and second polysilicon layers, wherein the first and second polysilicon layers are patterned to form the gate of the MOS drive transistor, and wherein the first and second polysilicon layers are patterned to provide a conductive path between the broken-down gate oxide layer in the active region and either the gate of the MOS drive transistor or drain of the reset transistor; and
   forming a highly doped diffusion region in the active region of the substrate to form the floating diffusion region, wherein the floating gate diffusion region is in contact with the lightly doped diffusion region.

2. The method of claim 1, wherein the first and second polysilicon layers are masked and etched to provide a conductive path between the broken down gate oxide layer in the active region and the gate of the MOS drive transistor.

3. The method of claim 1, wherein the first and second polysilicon layers are masked and etched to provide a conductive path between the broken-down gate oxide layer in the active region and the drain of the MOS reset transistor.

4. The method of claim 1, wherein the first and second polysilicon layers are masked and etched to provide a conductive path between the broken-down gate oxide layer in the active region and both the gate of the MOS drive transistor and the drain of the MOS reset transistor.

5. A method for fabricating a pixel of an image sensor, wherein the pixel comprises a floating gate diffusion region configured to receive photocharges from a photodetector of the pixel, a MOS drive transistor having a gate and configured as a source follower, and a MOS reset transistor having a drain, the method comprising:
   depositing an isolating field oxide about a peripheral portion of an area of a substrate to define an active region in the substrate;

forming a lightly doped diffusion region in the active region of substrate;

forming a gate oxide layer over the lightly doped diffusion region of the active region, wherein the gate oxide layer extends over a gate region of the MOS drive transistor;

forming a polysilicon layer over the gate oxide layer in the active region and over the gate oxide in the gate region of the MOS drive transistor;

forming a contact mask over the polysilicon layer in the active region, wherein the contact mask leaves at least a portion of the polysilicon layer exposed to form an unmasked region;

etching the polysilicon layer to reduce the thickness of the polysilicon layer in the unmasked region;

performing an ion-implantation process to direct ions through the polysilicon layer and into the gate oxide layer in the unmasked region to break down the gate oxide layer to thereby render the gate oxide layer in the unmasked region the gate oxide layer conductive and provide an electrically conductive path between the polysilicon layer and the lightly doped diffusion region;

removing the contact mask;

performing a gate masking and etching process to pattern the polysilicon layer, wherein the polysilicon layer is patterned to form the gate of the MOS drive transistor, and wherein the polysilicon layer is further patterned to provide a conductive path between the broken-down gate oxide layer in the active region and either the gate of the MOS drive transistor or the drain of the MOS reset transistor; and forming a highly doped diffusion region in the active region of substrate, wherein the highly doped diffusion region is in contact with the lightly doped diffusion region, and wherein the highly doped diffusion region forms the floating gate diffusion region of the pixel.

6. The method of claim 5, wherein the polysilicon layer is masked and etched to provide a conductive path between the broken-down gate oxide layer in the active region and the gate of the MOS drive transistor.

7. The method of claim 5, wherein the polysilicon layer is masked and etched to provide a conductive path between the broken down gate oxide layer in the active region and the drain of the MOS reset transistor.

8. The method of claim 5, wherein the polysilicon layer is masked and etched to provide a conductive path between the broken-down gate oxide layer in the active region and both the gate of the MOS drive transistor and the drain of the MOS reset transistor.

* * * * *

UNITED STATES PATENT AND TRADEMARK OFFICE
CERTIFICATE OF CORRECTION

PATENT NO. : 7,851,275 B2  
APPLICATION NO. : 11/444394  
DATED : December 14, 2010  
INVENTOR(S) : Choi et al.

Page 1 of 1

It is certified that error appears in the above-identified patent and that said Letters Patent is hereby corrected as shown below:

Column 10, line 48, in Claim 2, delete "broken down" and insert -- broken-down --.

Column 11, line 7, in Claim 5, delete "gate oxide" and insert -- gate oxide layer --.

Column 12, line 17, in Claim 7, delete "broken down" and insert -- broken-down --.

Signed and Sealed this
Twenty-sixth Day of April, 2011

David J. Kappos
*Director of the United States Patent and Trademark Office*